(12) United States Patent
Lewis (10) Patent No.: US 8,077,473 B1
(45) Date of Patent: Dec. 13, 2011

(54) SPRING-LATCHING CIRCUIT MODULE INJECTOR/EJECTOR

(75) Inventor: Donald Lewis, Richmond, CA (US)

(73) Assignee: Force10 Networks, Inc., San Jose ( * ) Notice: Subject to any disclaimer, the term of this patent is extended or adjusted under 35 U.S.C. 154(b) by 613 days.

(21) Appl. No.: 12/229,999

(22) Filed: Aug. 28, 2008

(51) Int. Cl.
*H05K 7/14* (2006.01)
(52) U.S. Cl. .................................. 361/754; 361/759
(58) Field of Classification Search .............. 361/754, 361/759
See application file for complete search history.

(56) References Cited

U.S. PATENT DOCUMENTS

| | | | | |
|---|---|---|---|---|
| 6,388,884 B1* | 5/2002 | Greco et al. | .............. | 361/754 |
| 7,292,456 B2* | 11/2007 | Leung et al. | .............. | 361/798 |
| 7,301,778 B1* | 11/2007 | Fang | .............. | 361/759 |
| 7,408,788 B2* | 8/2008 | Rubenstein | .............. | 361/801 |

* cited by examiner

*Primary Examiner* — Timothy Thompson
*Assistant Examiner* — Hiram E Gonzalez
(74) *Attorney, Agent, or Firm* — Robert Schuler (57) ABSTRACT

A lever assembly for use with electronic modules has a handle lever with a self-sprung cantilevered handle section. The cantilevered handle section can be flexed with respect to the non-cantilevered portion of the handle lever during module insertion to automatically engage a catch that prevents the handle lever from inadvertently or accidentally being released and unseating the module. Once the flexing force is removed, compression of the handle section remains at the catch, such that the handle section continues to apply leverage force in the closure direction to hold the module securely in place.

21 Claims, 8 Drawing Sheets

SPRING-LATCHING CIRCUIT MODULE INJECTOR/EJECTOR

BACKGROUND

1. Field of the Invention

The present disclosure relates generally to rack-mounted electronic devices, and more particularly to mechanical connection of electronic modules to a rack-mounted chassis.

2. Description of Related Art

Large electronic systems typically mount in racks that accept many different kinds of networking and computer gear. Some such systems are themselves often modular—"cards," "blades," "modules," and the like slide into a chassis built to accommodate multiple such units, with the chassis providing power, cooling, and/or intercommunication (e.g., across a backplane) for the modules. Each module is typically provided with one or more screws that align with holes in the chassis, allowing the module to be secured once inserted in the chassis.

Some modules, e.g., those that mate a large number of connector pins with a backplane, require significant force to fully make or break the electrical connectors. To this end, some modules provide one or more handles that leverage off of a chassis member to allow a technician to provide the force necessary to make or break the electrical connectors.

BRIEF DESCRIPTION OF THE DRAWINGS

The present invention can be best understood by reading the specification with reference to the following Figures, in which.

DETAILED DESCRIPTION

Prior art module retention systems and insertion/extraction handles have a variety of disadvantages. The use of make-up screws and the like to retain modules is inconvenient. Accessing the screws during module replacement may be difficult in some systems, due to limited visibility and workspace when neighboring modules remain connected to a large number of cables. Difficulty in starting the screws or damage to chassis threads can occur with slight misalignment. Some users thus tend to shortcut by engaging a module with the backplane using the insertion handles, and then relying on backplane connector friction to hold the module in place instead of making the retention screws up to the chassis. Modules that are not properly retained are subject to inadvertent—and possibly intermittent—disconnection of one or more backplane connections due to vibration, tugging due to the changing of external module connections or persistent cable tension, inadvertent bumping, and the like. Some users may also exert undue force on the insertion handles, not knowing when a reliable connection has been effected, resulting in possibly expensive damage to one or more system components.

The described embodiments provide a module insertion/extraction function and a module retention function integrated in a common lever assembly. A handle lever provides leverage for making and breaking module connections, e.g., to a backplane. The handle lever contains a cantilevered section that translates, under force, to a locking position when the module is fully inserted. This cantilevered section remain under spring compression when locked, providing a continuous retention force for the module. A release trigger unlocks the compressed section, allowing the handle lever to swing freely to a position that provides leverage for removing the module. In at least some embodiments, a user can engage and lock a module in a single motion of the handle lever, with no guessing as to when the module is fully engaged, and no separate action or mechanism required to secure the module.

Figure 1:
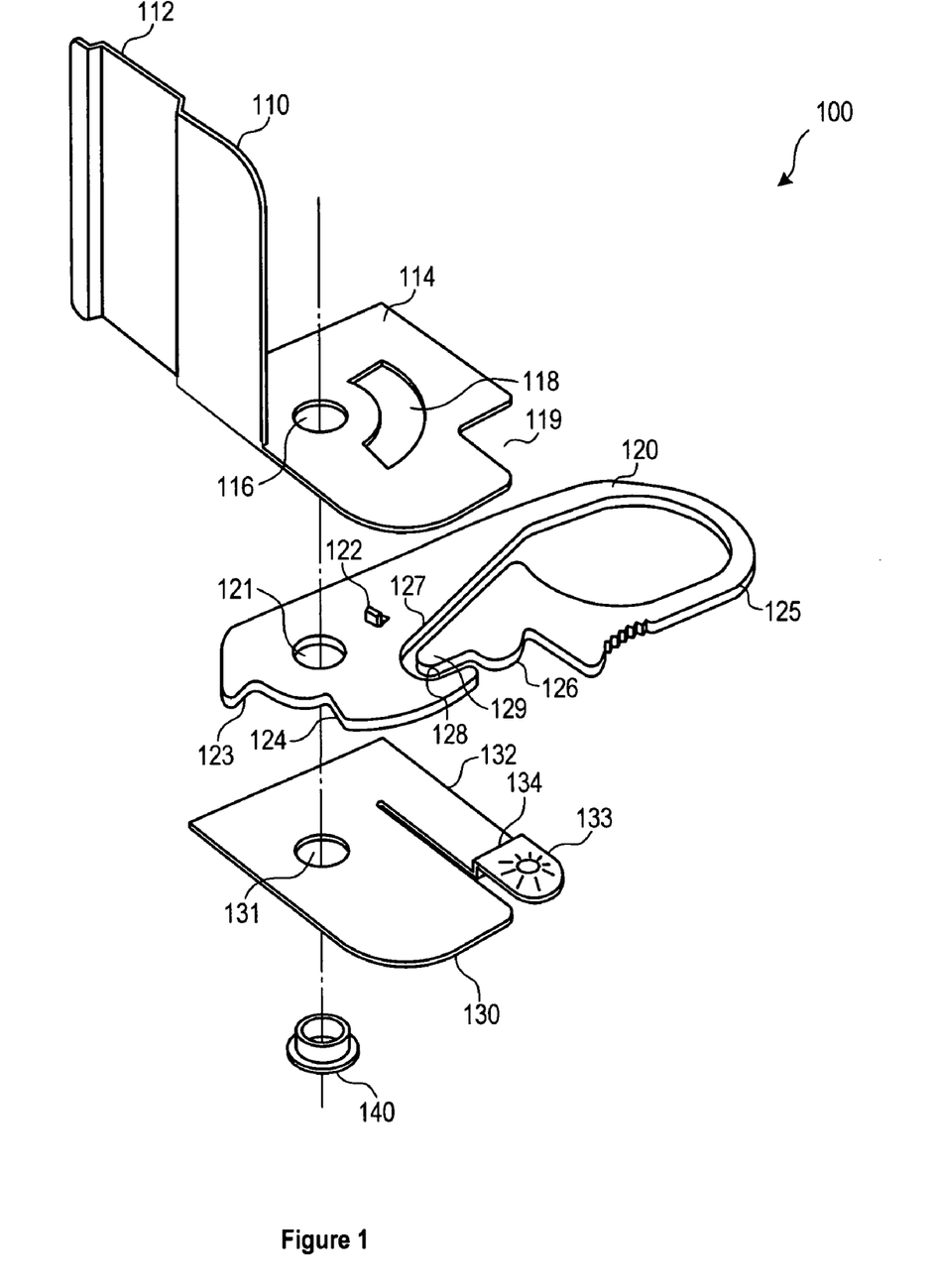
FIG. 1 illustrates, in exploded perspective view, a circuit module latch injector/ejector according to an embodiment.

FIG. 1 illustrates, in an exploded perspective view, the components of a lever assembly 100 according to a first embodiment. Lever assembly 100 comprises a mounting plate 110, a handle lever 120, a latch plate 130, and a swivel fastener 140.

Mounting plate 110 supports the connection of lever assembly 100 to, e.g., a corner of an electronic module. Vertical (e.g., vertical support 112) and horizontal (not visible in this view) members provide stiffness and attachment points for the lever assembly. Horizontal plate 114 contains a mounting hole 116 to receive swivel fastener 140, a semicircular limit hole 118 that receives a limit tab (122) on the handle lever 120, and a latch cutout 119 that allows user access to the latch mechanism, described below. Mounting plate 110 is typically fabricated from sheet aluminum or galvanized steel, machined and formed to produce the shape depicted.

Handle lever 120 provides leverage to allow a user to insert and remove a circuit module, and also cooperates with latch plate 130 to provide a module retention function. Handle lever 120 contains a cantilevered handle 125 that swivels about a mounting hole 121 to provide insertion leverage against a leverage face 123, and extraction leverage against a leverage face 124. Limit tab 122 projects upward from handle lever 120, within limit hole 118 when assembly is complete, to provide hard stops at both ends of the handle lever travel range. Handle lever 120 is typically fabricated of stainless spring steel plate or galvanized spring steel plate, machined and bent (tab 122) to form the shape depicted.

Handle 125 contains a looped opening large enough for an operator to insert several fingers in order to grasp the handle. The looped opening is not, however, a closed shape. Instead, a channel 127 separates the front section of the looped opening from the rear section of the looped opening on the inboard side of the handle lever. In the FIG. 1 embodiment, the looped opening is approximately oval (resembling on oval racetrack with straightaways oriented parallel to the long axis of handle lever 120) in shape, with the channel 127 starting near the backside (the side closest to the equipment when the latch is closed) inboard corner of the oval. The channel angles away from the backside of the handle lever 120 as it diverges from the oval opening, such that by the time the channel approaches the swivel end of handle lever 120, the back section of the handle lever is wide enough to accommodate mounting hole 121 and limit tab 122. Channel 127 then curls toward the front face of handle lever 120, forming a concave opening in the back section of the handle lever.

Due to the positioning of channel 127, substantially the entirety of the oval opening in handle 125 is defined by a cantilevered handle member extending from the backside of the handle lever 120. The cantilevered handle member comprises handle 125, lock tab 126, and force limit tab 129. The cantilevered construction allows the cantilevered handle member to flex as force is applied to it, with the degree of flexion determined by the cantilevered length, cross-sectional dimensions, and material type selected for handle lever 120. The amount of flexion due to pushing on handle 125 is limited by force limit tab 129 striking the back side of channel 127. The amount of flexion due to pulling on handle 125 is limited by force limit tab 129 striking the front side of channel 127 (surface 128). Thus movement of handle 125 under force can be maintained within the elastic limits of the material by controlling the resting difference between limit tab 129 and channel 127 (both the backside and surface 128).

Latch plate 130 comprises a plate having a mounting hole 131 to receive swivel fastener 140 and a spring latch arm 132. Spring latch arm 132 is a cantilevered section of the plate that extends away from the module served by lever assembly 100, the latch arm terminating in a release tab 133 projected above the remainder of latch plate 130 by an intermediate vertical catch surface 134. Latch plate 130 is typically fabricated from sheet spring steel or spring stainless steel, machined and formed to produce the shape depicted.

Swivel fastener 140 comprised a rivet or other common fastener that can pass through mounting holes 116, 121, and 131 to hold mounting plate 110, handle lever 120, and latch plate 130 together while allowing rotation of handle lever 120 with respect to plates 110 and 130.

Figure 2A:
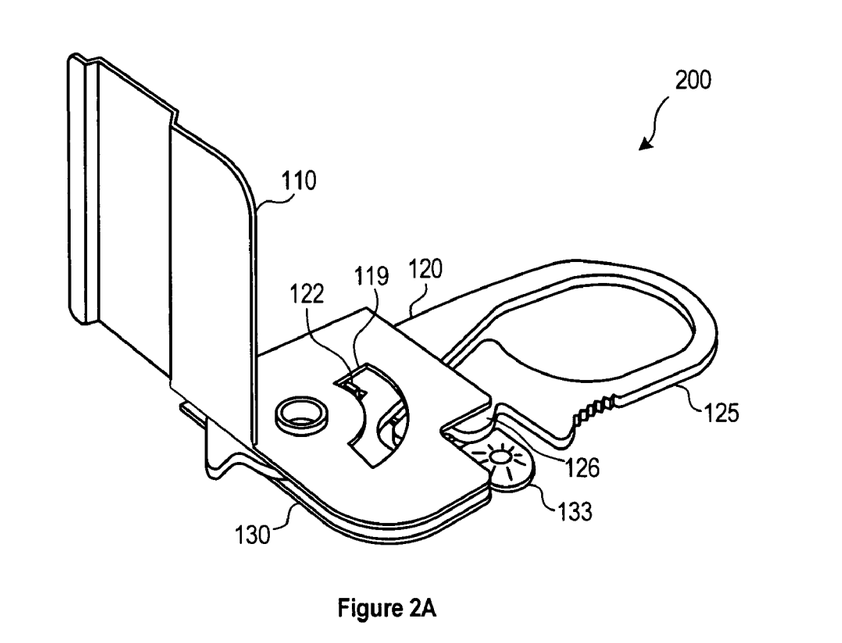
FIGS. 2A and 2B, show in assembled perspective view, the embodiment of FIG. 1 unlatched and latched, respectively.
Figure 2B:
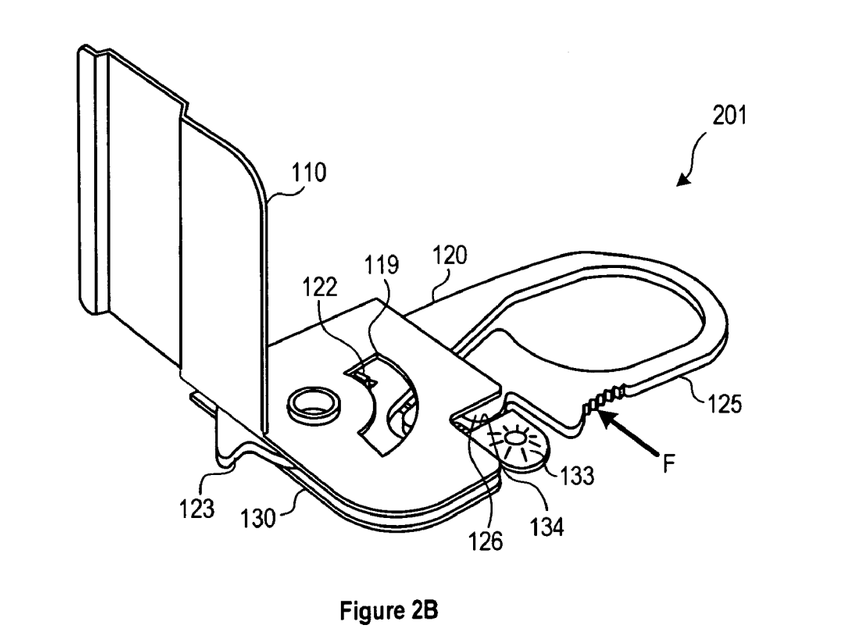

FIGS. 2A and 2B illustrate an assembled view of lever assembly 100, respectively, in closed, unlatched and closed, latched positions 200 and 201. In FIG. 2A, handle lever 120 is fully closed, either because limit tab 122 is resting against the close limit surface 119 of mounting plate 110, or because the module to which the lever assembly is attached (not shown) has reached its mechanical insertion limit. In this position, lock tab 126 depresses release tab 133 such that handle 125 rides over the top of release tab 133.

In FIG. 2B, a force F is applied to handle 125, once further movement of handle 125 is resisted by limit tab 122 or a module's mechanical insertion limit. Force F causes handle 125 to flex such that lock tab 126 clears the vertical catch surface 134, allowing release tab 133 to spring up to its normal position. When force F is relaxed, spring force attempts to restore lock tab 126 to its relaxed position. Vertical catch surface 134 now acts as a complementary feature to engage lock tab 126, interfering with the backwards movement of lock tab 126, such that handle lever 120 remains in a latched position. The compression of handle 125 with the vertical catch surface engaged exerts a force on leverage face 123 to maintain a module snugged in place.

To remove the module, an operator presses down on the top surface of release tab 133 until vertical catch surface 134 clears the front face of lock tab 126, allowing lock tab 126 to spring back to its relaxed position. Handle lever 120 now is in the FIG. 2A position, and is free to swing forward to extract the module.

Figure 3:
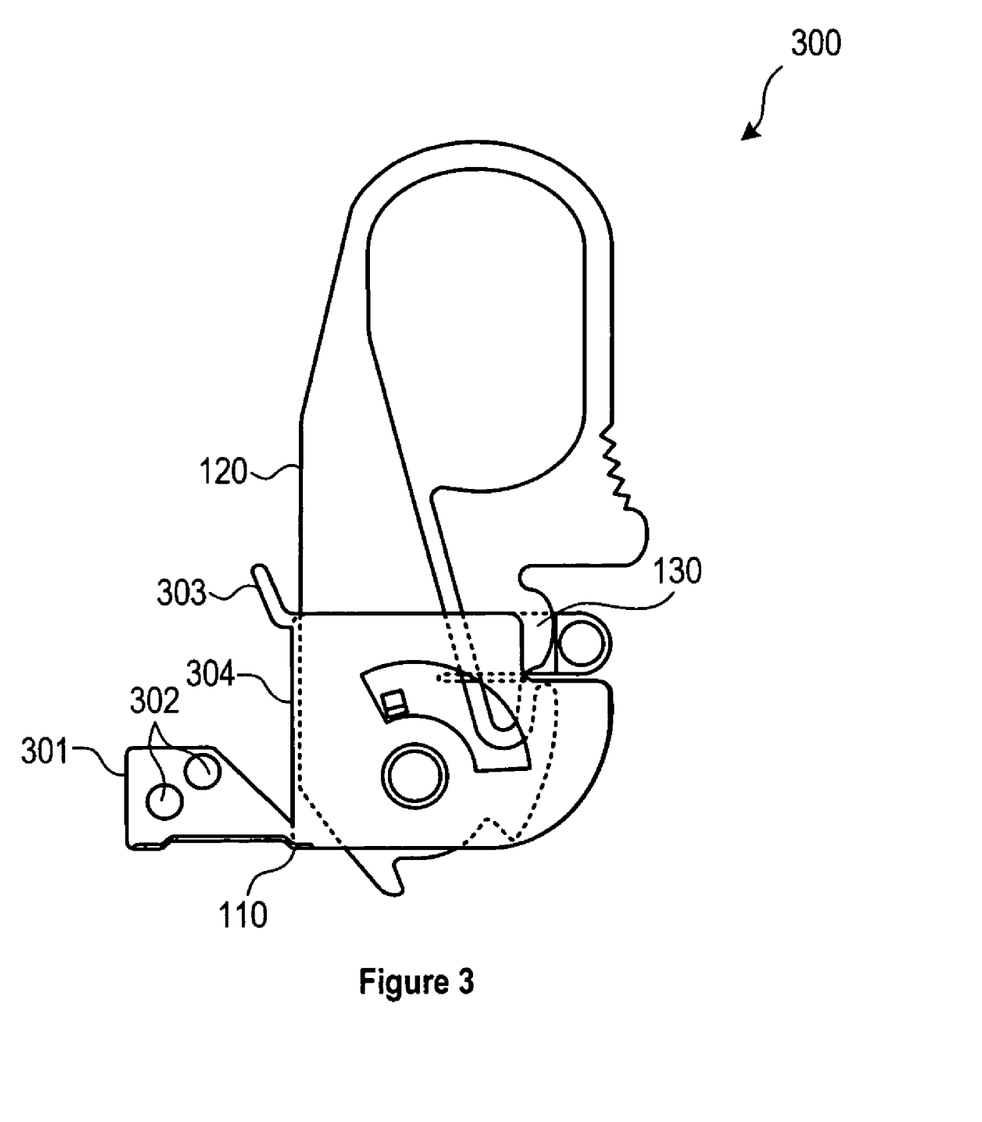
FIG. 3 shows a top view of an assembled circuit module latch injector/ejector according to an embodiment.

FIG. 3 illustrates a top view 300 of the assembly. Additional mounting structure, including a lateral mounting tab 301 with mounting holes 302 not visible in FIGS. 1, 2A, and 2B, and an alignment prong 303, are visible in top view 300. Alignment prong 303 inserts in a matching slot in a module (not shown), and then the rear surface 304 of mounting plate 110 (as well as the rear surface of mounting plate 130 underneath) are made up against the front of the module and secured by screws (not shown) through holes 302.

FIGS. 4A-4H show, from a top view, the insertion and extraction of a module 400, equipped with an exemplary lever assembly embodiment, from a chassis 410. Module 400 comprises a connector block 402. Chassis 410 comprises a complementary connector block 412. The side of chassis 410 includes a mounting extension 414 with a latching notch 416. An EMI (ElectroMagnetic Interference) gasket 404 is also shown affixed to module 400—gasket 404 slides along the inner surface of mounting extension 414 as module 400 is inserted in chassis 410.

Figure 4A:
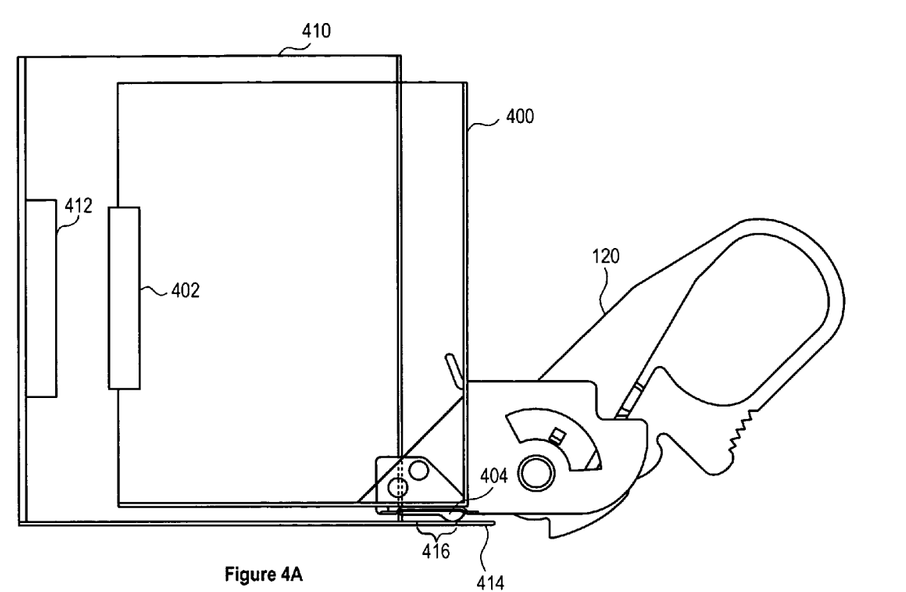
FIGS. 4A-4H show a circuit module provisioned with a circuit module latch injector/ejector according to an embodiment, during various positions during insertion and extraction of the module from a chassis.

In FIG. 4A, module 400 is loosely engaged with chassis 410. Handle lever 120 is free to move in a range of extended to semi-extended positions.

Figure 4B:
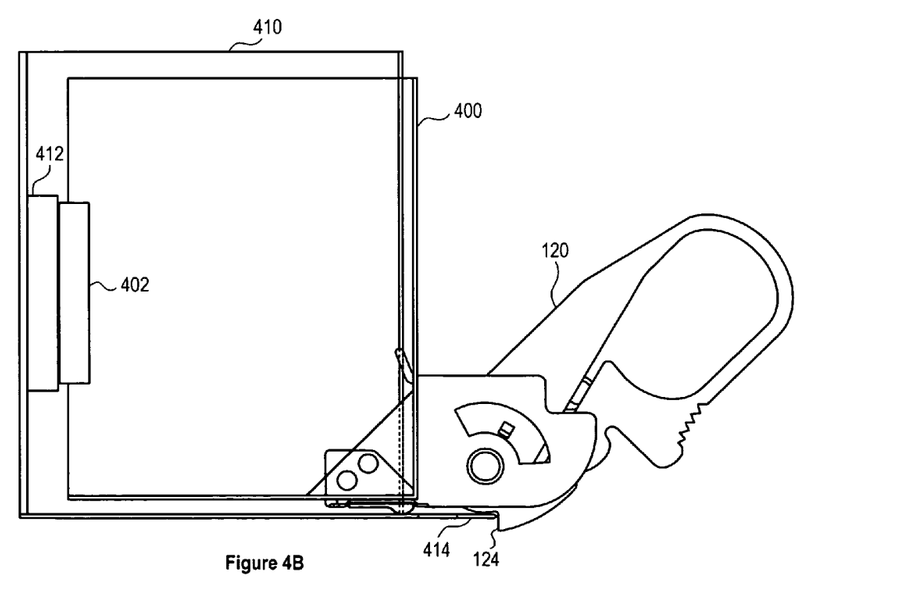

In FIG. 4B, module 400 has been slid into chassis 410 to a point where connector blocks 402 and 412 almost begin to engage. Leverage face 124 of handle lever 120 contacts the front of mounting extension 414, such that handle lever 120 begins to close.

Figure 4C:
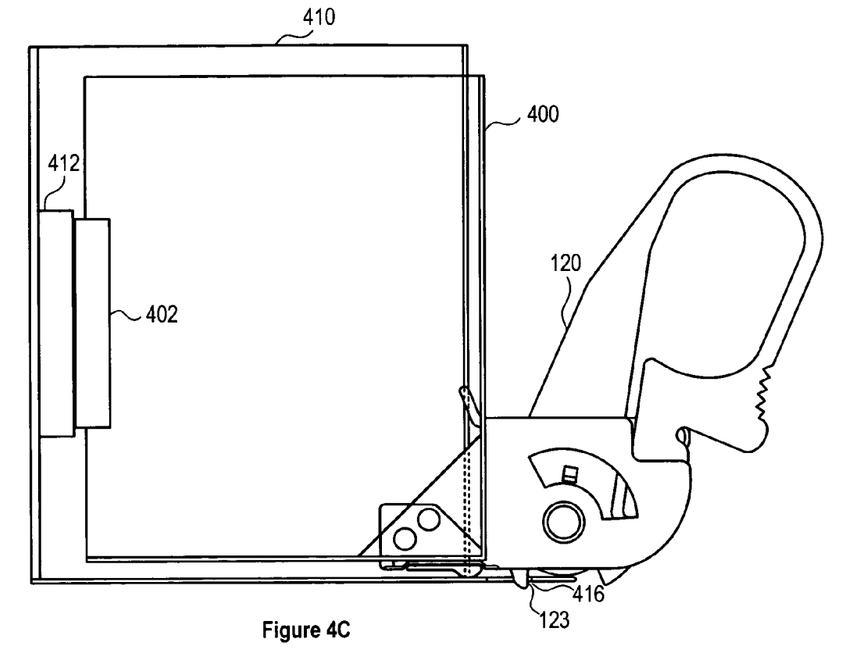

Referring now to FIG. 4C, handle lever 120 is now swung back toward the module face until leverage face 123 of handle lever 120 enters latching notch 416 and comes to rest against the front end of the latching notch.

Figure 4D:
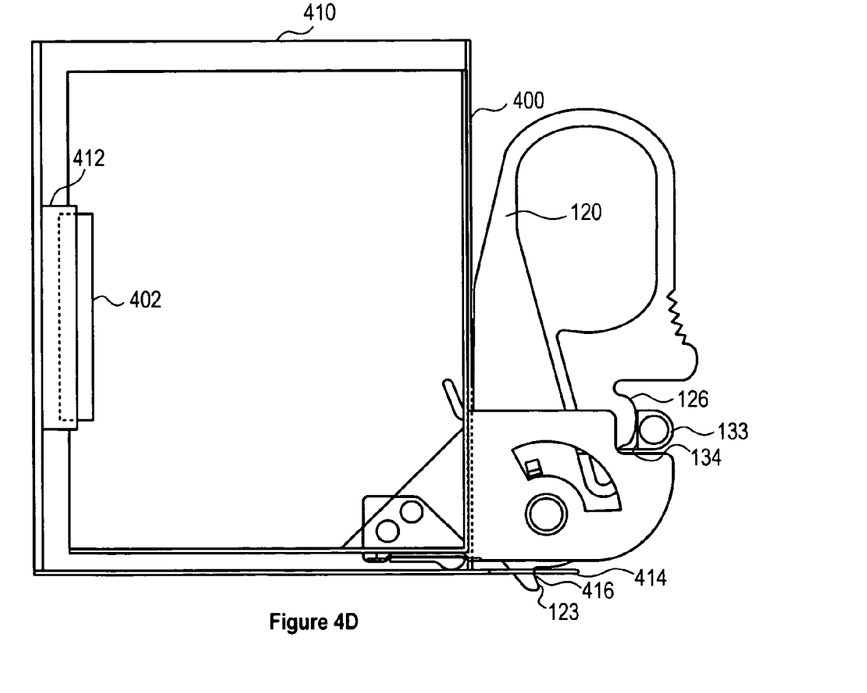

In FIG. 4D, handle lever 120 is pushed back toward the module face, which causes leverage face 123 to push against the front end of latching notch 416 on mounting extension 414. This causes module 400 to slide back fully into chassis 410, making connector blocks 402 and 412. When the module is fully engaged, further force on handle lever 120 causes latch tab 126 to flex toward the face of the module, freeing release tab 133 from underneath latch tab 126. Release tab 133 springs upward to its relaxed position, latching handle lever 120 in the flexed position. Handle lever 120 holds module 400 secure as long as the handle lever remains latched.

Figure 4E:
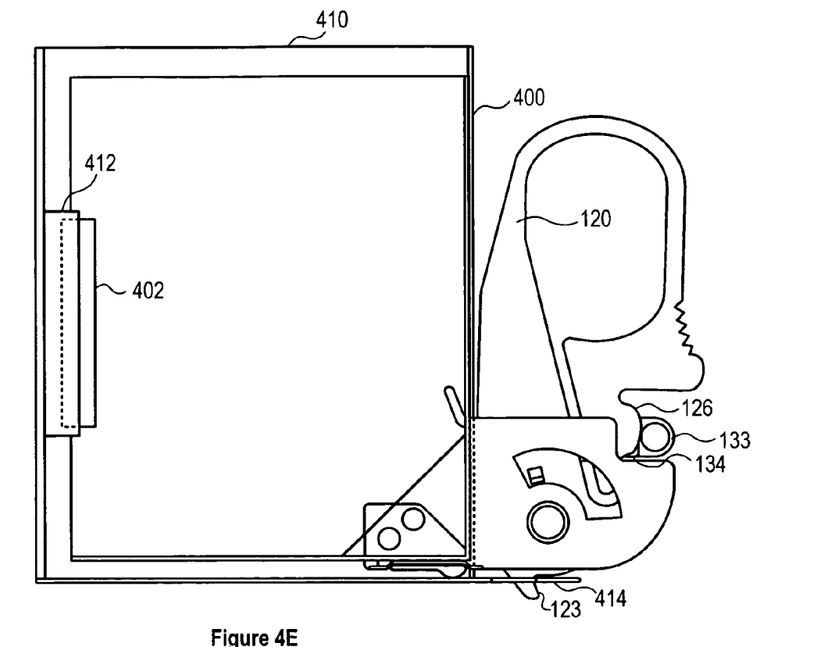

FIGS. 4E-4H illustrates a process for unlatching and removing module 400 from chassis 410. In FIG. 4E, release tab 133 is depressed such that the vertical face 134 of the release tab drops below latch tab 126. This causes latch tab 126 to spring forward to its relaxed position, once again trapping release tab 133 below the handle lever 120. Handle lever 120 is now in an unlatched position.

Figure 4F:
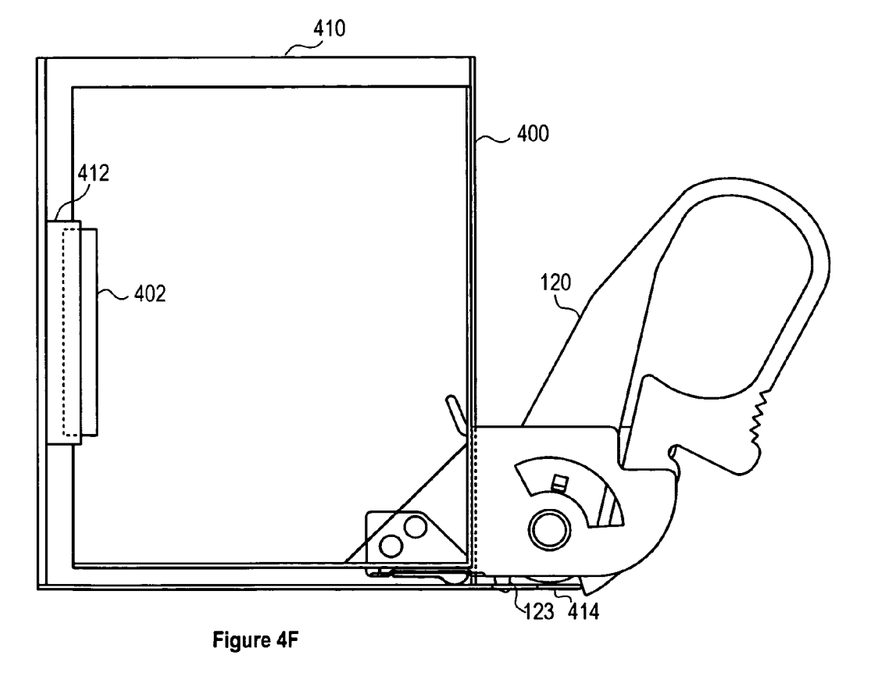
Figure 4G:
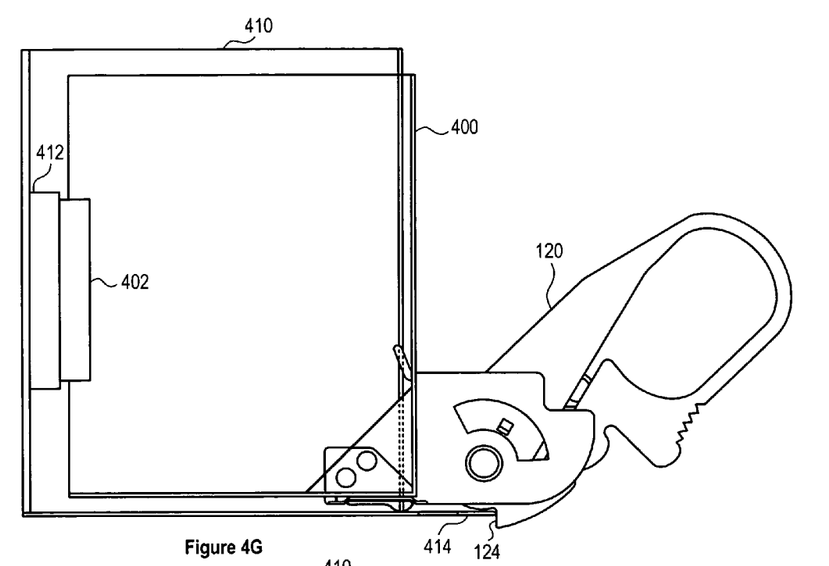
Figure 4H:
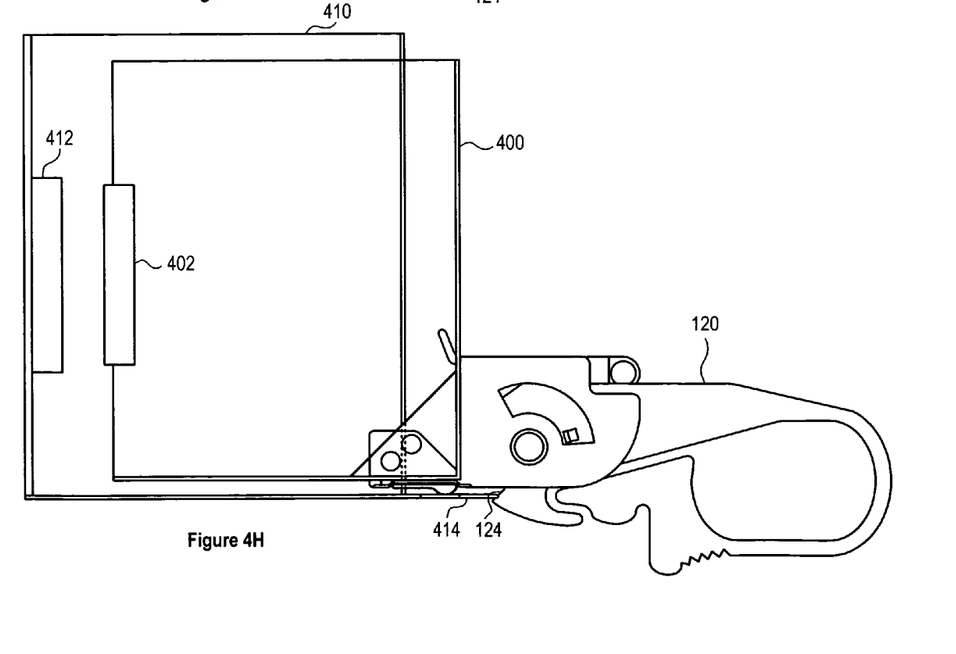

Once handle lever 120 is unlatched, it may now be pulled forward to the position shown in FIG. 4F, where leverage face 124 contacts the front of mounting extension 414. Then, as handle lever 120 is pulled further forward, leverage face 124 pushes against mounting extension 414, pulling module 400 forward and decoupling connector blocks 402 and 412 (FIG. 4G). FIG. 4H shows handle lever 120 at full extension. From anywhere between the FIG. 4G and FIG. 4H positions, module 400 should slide easily from chassis 410.

Figure 5:
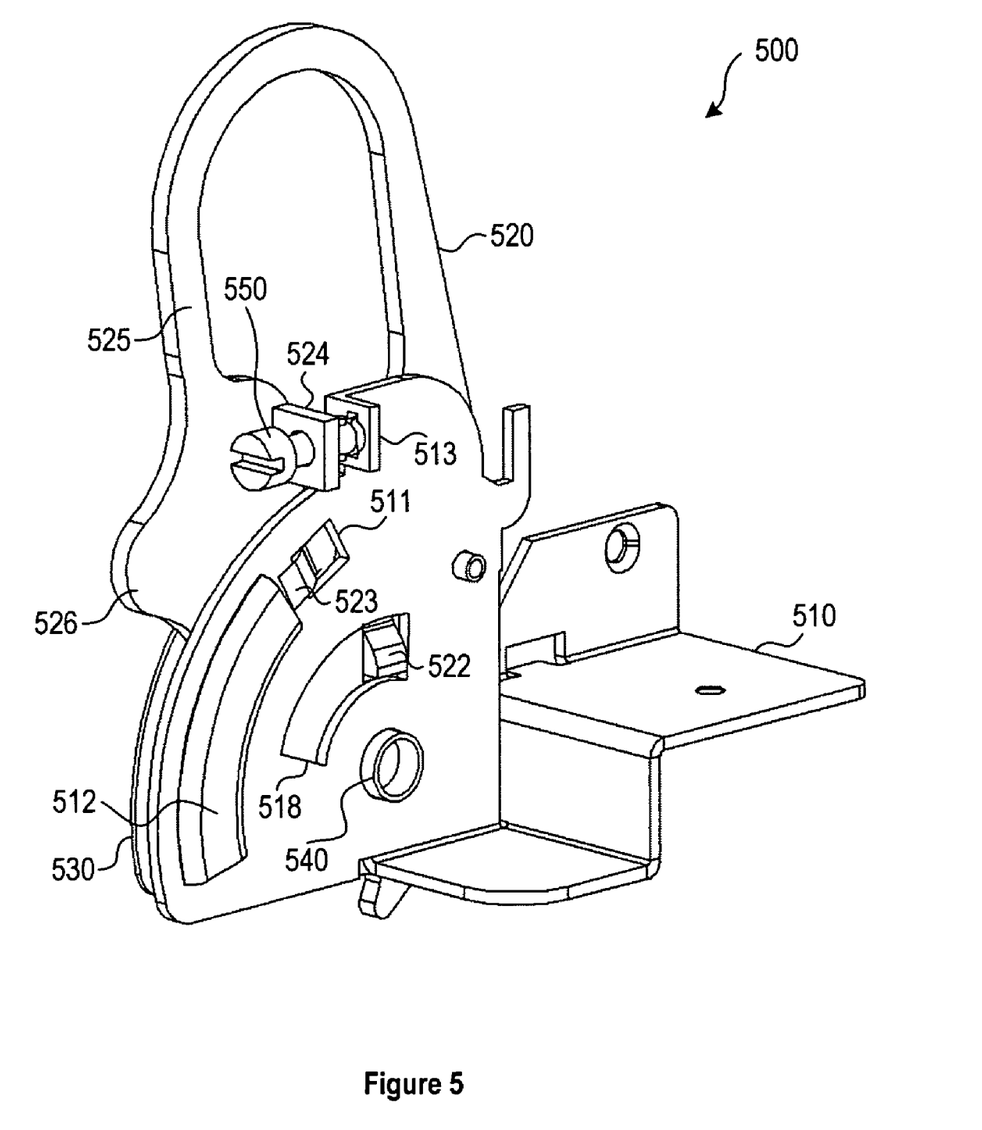
FIG. 5 shows a circuit module latch injector/ejector according to an embodiment with a screw securing mechanism.

Various other embodiments can utilize the concepts described to provide a latching handle. FIG. 5 shows a lever assembly 500 having a latching function and a lock function, lever assembly 500 including a mounting plate 510, a latch handle 520, a backing plate 530, and a swivel fastener 540 that holds latch handle 520 between plates 510 and 530, while allowing relative rotation of latch handle 520.

Mounting plate 510 is similar in many respects to mounting plate 110 of the first embodiment. A semicircular limit hole 518 receives a limit tab 522 on a handle lever 520, for instance. Three new features are shown as well on mounting plate 510. A latch hole 511 and a latch guide channel 512 are arranged in a second semicircular arc outboard of semicircular limit hole 518, and a locking fastener receiver 513 projects above the plane of the mounting plate 510. The function of each are described below with reference to the complementary features of latch handle 520.

Latch handle 520 includes a limit tab 522 and a cantilevered handle section 525 including a catch tab 523, a release tab 526, and a locking fastener retainer 524 that captures a locking fastener 550. Limit tab 522 swings within semicircular limit hole 518 between a fully open stop at one end of the limit hole and a fully closed stop at the other end of the limit hole. Catch tab 523 swings within latch guide channel 512 until the latch handle nears the closed position. As the latch handle nears the closed position and meets resistance, either because a module is nearing full insertion or because limit tab 522 meets its closed stop, further force on the cantilevered handle section 525 flexes section 525 with respect to the non-cantilevered portion of latch handle 520. As the cantilevered handle section 525 flexes, catch tab 523 rides under the end of latch guide channel 512 until catch tab 523 pops into latch hole 511. Catch tab 523 and latch hole 511 then engage to prevent cantilevered handle section 525 from springing fully back to its relaxed position.

When catch tab 523 and latch hole 511 are engaged, locking fastener 550 is brought into alignment with locking fastener receiver 513. An operator desiring to prevent easy opening of the latch handle engages locking fastener 550 with locking fastener receiver 513. For instance, locking fastener 550 can be a spring-loaded screw with a threaded section or a key that engages with complementary features in locking fastener receiver 513 when the screw is depressed and turned. To unlock the fastener, the screw is depressed and turned in the opposite direction to free it from locking fastener receiver 513.

To disengage catch tab 523 from latch hole 511, an operator presses down on release tab 526 to flex cantilevered handle section 525 orthogonal to the direction of closure and opening. Movement of cantilevered handle section 525 in this direction is resisted, and ultimately stopped, by backing plate 530. Backing plate 530 flexes within elastic limits sufficient to move catch tab 523 below the plane of latch hole 511, at which time the compression on cantilevered handle section 525 is released, springing catch tab 523 back into latch guide channel 512. Handle lever 520 is now free to rotate to its open position as desired.

Those skilled in the art will appreciate that the embodiments and/or various features of the embodiments can be combined in other ways than those described. Although small electronic modules using one latch handle are shown in the operational figures, larger modules may advantageously apply two latch handles, one on each side, or in other desirable arrangements. The latch handle may also be mounted to the chassis instead of the modules if so desired. A locking function, such as that shown on the FIG. 5 embodiment, may also be included on the FIG. 1 embodiment. Numerous complementary feature arrangements are compatible with the disclosed lever assemblies and method of holding a cantilevered handle section under compression. Likewise, numerous locking fastener arrangements are also possible. Many other examples of optimizations or implementation differences exist within the broad scope of this disclosure.

Although the specification may refer to "an", "one", "another", or "some" embodiment(s) in several locations, this does not necessarily mean that each such reference is to the same embodiment(s), or that the feature only applies to a single embodiment.

What is claimed is:

1. An electronic module comprising:
a module chassis;
at least one lever assembly having
a stationary support secured to the module chassis, and
a handle lever secured to the stationary support so as to allow rotation of the handle lever relative to the stationary support, the handle lever having a self-sprung cantilevered handle section and a leverage face to hold the module chassis in an equipment chassis when the handle lever is in a closed position,
the stationary support and self-sprung cantilevered handle section having complementary features that engage to hold the handle lever in the closed position when the handle lever is in the closed position and the cantilevered handle section is flexed in the direction of closure.

2. The electronic module of claim 1, the lever assembly further comprising a release tab to disengage the complementary features, allowing the handle lever freedom to rotate away from the closed position.

3. The electronic module of claim 2, wherein the release tab is integral to the handle section, the release tab moving the handle section orthogonal to the direction of closure to disengage the complementary features.

4. The electronic module of claim 3, wherein the complementary features comprise a catch on the handle section and a latch hole on the stationary support.

5. The electronic module of claim 2, wherein the release tab is integral to the stationary support.

6. The electronic module of claim 5, wherein the complementary features comprise a latch surface on the handle section and a catch surface on the stationary support, the release tab moving the catch surface orthogonal to the direction of closure to disengage the complementary features.

7. The electronic module of claim 1, the handle lever further comprising a locking fastener, the stationary support further comprising a locking fastener receiver that is brought into proximity to the locking fastener when the complementary features are engaged such that the locking fastener is lockable to the locking fastener receiver, the locking fastener when locked preventing the handle lever from opening.

8. The electronic module of claim 7, wherein the locking fastener when locked prevents the complementary features from being disengaged.

9. A method of positioning an electronic module in an equipment chassis, the method comprising:
leveraging a rotatable handle lever in a closure direction to seat the module in the chassis;
applying an external flexing force to a self-sprung cantilevered handle section of the handle lever in the closure direction to automatically engage a catch that holds the self-sprung cantilevered handle section in compression, such that leverage force in the closure direction continues to be applied by the handle lever after the external flexing force is relaxed.

10. The method of claim 9, further comprising activating a locking fastener that prevents unseating of the module in the event that the catch is disengaged.

11. The method of claim 9, further comprising releasing the compression in the self-sprung cantilevered handle section by operating a release to disengage the catch, allowing the rotatable handle lever to swing in an open direction.

12. The method of claim 11, further comprising leveraging the rotatable handle lever in the open direction to unseat the module from the chassis.

13. A lever assembly comprising:
a stationary support; and
a handle lever secured to the stationary support so as to allow rotation of the handle lever relative to the stationary support, the handle lever having a self-sprung cantilevered handle section and a leverage face;
the stationary support and self-sprung cantilevered handle section having complementary features that engage to hold the handle lever in a closed position when the handle lever is in the closed position and the cantilevered handle section is flexed in the direction of closure.

14. The lever assembly of claim 13, further comprising a release tab to disengage the complementary features, allowing the handle lever freedom to rotate away from the closed position.

15. The lever assembly of claim 14, wherein the release tab is integral to the handle section, the release tab moving the handle section orthogonal to the direction of closure to disengage the complementary features.

16. The lever assembly of claim 15, wherein the complementary features comprise a catch on the handle section and a latch hole on the stationary support.

17. The lever assembly of claim 14, wherein the release tab is integral to the stationary support.

18. The lever assembly of claim 17, wherein the complementary features comprise a latch surface on the handle section and a catch surface on the stationary support, the release tab moving the catch surface orthogonal to the direction of closure to disengage the complementary features.

19. The lever assembly of claim 13, the handle lever further comprising a locking fastener, the stationary support further comprising a locking fastener receiver that is brought into proximity to the locking fastener when the complementary features are engaged such that the locking fastener is lockable to the locking fastener receiver, the locking fastener when locked preventing the handle lever from opening.

20. The lever assembly of claim 19, wherein the locking fastener when locked prevents the complementary features from being disengaged.

21. The lever assembly of claim 13, the handle lever further comprising integral stops that prevent the self-sprung cantilevered handle section from moving past its elastic limits in the direction of closure and away from the direction of closure.

* * * * *